United States Patent [19]

Sorrell et al.

[11] Patent Number: 5,155,337
[45] Date of Patent: Oct. 13, 1992

[54] METHOD AND APPARATUS FOR CONTROLLING RAPID THERMAL PROCESSING SYSTEMS

[75] Inventors: Furman Y. Sorrell, Cary; Ronald S. Gyurcsik, Raleigh, both of N.C.; John A. Harris, Clarksville, Va.

[73] Assignee: North Carolina State University, Raleigh, N.C.

[21] Appl. No.: 454,631

[22] Filed: Dec. 21, 1989

[51] Int. Cl.$^5$ .............................................. H05B 1/02
[52] U.S. Cl. ................................... 219/411; 219/413; 219/497; 219/492; 219/491; 340/589
[58] Field of Search .............. 219/494, 491, 497, 503, 219/492, 506, 501, 411, 413; 340/588, 586

[56] References Cited

U.S. PATENT DOCUMENTS

| | | | |
|---|---|---|---|
| 4,115,163 | 9/1978 | Gorina et al. | 250/492 |
| 4,151,008 | 4/1979 | Kirkpatrick | 148/1.5 |
| 4,155,779 | 5/1979 | Auston et al. | 148/1.5 |
| 4,331,485 | 5/1982 | Gat | 148/1.5 |
| 4,332,833 | 6/1982 | Aspnes et al. | 427/8 |
| 4,434,342 | 2/1984 | Shubring | 219/497 |
| 4,522,845 | 6/1985 | Powell et al. | 148/189 |
| 4,543,822 | 10/1985 | Sorrell et al. | 148/1.5 |
| 4,614,860 | 9/1986 | Kativois | 219/492 |
| 4,661,177 | 4/1987 | Powell | 148/1.5 |
| 4,755,654 | 7/1988 | Crowley et al. | 219/405 |
| 4,787,551 | 11/1988 | Hoyt et al. | 228/179 |

FOREIGN PATENT DOCUMENTS

| | | |
|---|---|---|
| 55-113336 | 9/1980 | Japan . |
| 57-149739 | 9/1982 | Japan . |
| 58-112327 | 7/1983 | Japan . |
| 59-3921 | 1/1984 | Japan . |
| 2065973 | 7/1981 | United Kingdom . |

OTHER PUBLICATIONS

Technical Notes, "Introduction to Infrared Thermometry", Ircon, Inc., TN102, pp. 1-7.
ASTM Special Technical Publication, "Applications of Radiation Thermometry", Richmond, J. and DeWitt, D., (PCN) 04-895000-40, May 8, 1984, pp. 3-23.
Principles of Optics, "Electromagnetic Theory of Propagation, Interference and Diffraction of Light", Born, M. and Wolf, E., pp. 51-70.
Radiation and Optics, "An Introduction to the Classical Theory", Stone, J., pp. 389-417.
Proceedings of Materials Research Symposium, "Broadband Pyrometry and the Effects of Roughness on RTP Repeatability", Hodul, D., Jun. 1989.
Proceedings of Symposium on Rapid Thermal Annealing/CVD and Integrated Processing, "Pyrometric Emissivity Measurements and Compensation In An RTP Chamber", Hodul, D., Spring 1989.
IEEE Transactions on Electron Devices, "RAPS—A Rapid Thermal Processor Simulation Program", Shieh, T. and Carter, R., vol. 36, No. 1, Jan. 1989, pp. 19-24.
Materials Research Society, "The Effect of Thin Dielectric Films on the Accuracy of Pyrometric Temperature Measurement", Pettibone et al., *Met. Res. Symp. Proc.*, vol. 52, pp. 209-216.

Primary Examiner—Mark H. Paschall
Attorney, Agent, or Firm—Bell, Seltzer, Park & Gibson

[57] ABSTRACT

A rapid thermal processing system is accurately controlled during a deposition process, in which the emissivity of the substrate material changes as a function of the thickness of the deposited layer, by determining the expected emissivity as a function of time during deposition and applying the expected emissivity to a controller to produce a converted temperature which controls the radiant heat sources of the rapid thermal processing system. In one embodiment, the expected emissivity is used to convert a measured pyrometer temperature into a converted pyrometer temperature. The converted pyrometer temperature is applied to a feedback controller which controls the radiant heaters so that the converted pyrometer temperature equals the desired wafer processing temperature. In another embodiment, the expected emissivity is employed to convert the desired rapid thermal processing temperature into a converted desired rapid thermal processing temperature. The converted desired rapid thermal processing temperature is provided to the controller, which controls the radiant heaters so that the measured pyrometer temperature is equal to the converted desired rapid thermal processing temperature.

13 Claims, 3 Drawing Sheets

METHOD AND APPARATUS FOR CONTROLLING RAPID THERMAL PROCESSING SYSTEMS

FIELD OF THE INVENTION

This invention relates to rapid thermal processing systems for fabricating semiconductor wafers and other microelectronic devices, and more particularly to a method and apparatus for controlling the processing temperature of a rapid thermal processing system during processing of a semiconductor wafer or other microelectronic device.

BACKGROUND OF THE INVENTION

Rapid Thermal Processing (RTP) systems are increasingly being used for microelectronic device fabrication. As is well known to those having skill in the art, rapid thermal processing systems attain a desired processing temperature rapidly, without the need for a lengthy "ramp up" period. It has been found that rapid thermal processing systems allow microelectronic devices to be fabricated at high temperatures without causing dopant diffusion or other unwanted side effects. Since rapid thermal processing systems typically process semiconductor wafers, the term "wafer" will be used herein to designate any device processed in the rapid thermal processing system. It will be understood by those having skill in the art that other substrates or materials may be processed.

In contrast with a conventional furnace which typically uses resistive heating units, a rapid thermal processing system typically uses radiant heat sources, for example arc lamps or tungsten-halogen lamps. A small heating chamber is typically used, to provide a controlled environment for the wafer to be processed and to efficiently couple the heat energy from the radiant energy sources to the wafer.

Rapid thermal processing systems typically employ a pyrometer for sensing the temperature of the wafer. As is well-known to those having skill in the art, a pyrometer is a radiation sensitive thermometer which provides contactless temperature sensing by measuring emitted radiation from the wafer at a particular radiation wavelength and at an assumed wafer emissivity. Pyrometers have been used in temperature control systems for rapid thermal processors to maintain constant wafer temperature. In a temperature control system, a controller is employed in a feedback configuration to regulate the radiant heat sources based upon deviations of the measured pyrometer temperature from a desired wafer temperature. The design and construction of rapid thermal processing systems are well-known to those having skill in the art and are described, for example, in U.S. Pat. No. 4,115,163 to Gorina et al. and U.S. Pat. No. 4,755,654 to Crowley et al.

In the semiconductor manufacturing art, rapid thermal processing systems have been heretofore used for rapid thermal annealing and rapid thermal oxidation of semiconductor wafers. See for example U.S. Pat. No. 4,331,485 to Gat. In an annealing or oxidation process, it has been found that appreciable changes in the radiation properties of the wafer are not produced, so that the pyrometer measurement may be used to accurately control the radiant heat sources.

Attempts have recently been made to use rapid thermal processing systems for depositing layers on a semiconductor substrate, for example in a rapid thermal chemical vapor deposition (RTCVD) process. One thin film deposition which is widely used in microelectronic device fabrication is the deposition of a thin film of polycrystalline silicon on a silicon dioxide layer on the surface of a silicon wafer. Unfortunately, it has been found that a thin film deposition often dramatically changes the radiative heat transfer properties of the wafer, and thereby causes erroneous pyrometer readings, leading to unacceptable process variations in the RTCVD process. For example, when an opaque polycrystalline silicon film is deposited on the transparent silicon dioxide layer at the silicon wafer surface, the emissivity of the wafer changes dramatically as its surface changes.

The above-described changes in wafer emissivity as a function of a deposited material have been widely reported in the art. For example, in a publication entitled "The Effect of Thin Dielectric Films on the Accuracy of Pyrometric Temperature Measurement" published in the Materials Research Society Symposium Proceedings, Vol. 52, pages 209-216, by D. W. Pettibone et al., 1986, it is reported that in RTCVD, the thin films being deposited may impact the emissivity of the wafer. Pettibone et al. conclude that pyrometer recalibration is necessary to accurately measure wafer temperature in such a process. However, there is no suggestion as to how pyrometer recalibration may be accomplished.

Similarly, a publication entitled "Pyrometric Emissivity Measurements and Compensation in an RTP Chamber" published in the Spring, 1989 Proceedings of the Symposium on Rapid Thermal Annealing/CVD and Integrated Processing by Nulman et al., discloses a need for correcting pyrometer readings when depositing thin dielectric films in a rapid thermal processing process. Nulman et al. concludes that "the use of in situ emissivity correction systems, capable of taking into account the emissivity dependence on temperature, chamber reflectivity and pyrometer wavelength are essential for accurate temperature measurement in RTP systems". However, there is no suggestion as to how in-situ emissivity correction systems may be designed or how such in-situ emissivity correction may take place.

One proposal for compensating for changes in emissivity of the wafer as a function of thin film thickness is disclosed in a publication entitled "Broadband Pyrometry and Effects of Roughness on RTP Repeatability" published in the Proceedings of Materials Research Symposium, June, 1989, by D. Hodul. Hodul discloses the use of two pyrometers which are calibrated at different wavelengths. By using two pyrometers and a look-up table, deposition can be corrected as the film is deposited. Unfortunately, this system requires two pyrometers and two windows in the rapid thermal processing furnace, thereby increasing the cost of the rapid thermal processing system. Moreover, a complicated control algorithm is necessary for controlling power to the radiant heat sources as a function of two pyrometer readings. It is also difficult to modify an existing controller to use two pyrometers. Finally, it is known that semiconductor wafers tend to emit radiation within a narrow band of wavelengths in the infrared region. It has proven difficult to reliably control the system using two pyrometers which must measure different wavelengths within this narrow band.

SUMMARY OF THE INVENTION

It is therefore an object of the present invention to provide an improved method and apparatus for controlling a rapid thermal processing system.

It is yet another object of the invention to provide a method and apparatus for controlling a rapid thermal processing system during a deposition process in which the emissivity of the wafer changes as a function of a deposited layer.

It is still another object of the present invention to provide a method and apparatus for controlling rapid thermal processing systems using a single pyrometer.

It is still a further object of the present invention to provide a simple method and apparatus for controlling a rapid thermal processing system to account for varying wafer emissivity.

It is yet a further object of the invention to provide a simple method and apparatus for controlling rapid thermal processing systems by modifying existing controllers.

These and other objects are provided, according to the present invention, by a method and apparatus for controlling a rapid thermal processing system in which the expected emissivity of a wafer is determined as a function of time during deposition of a thin film layer thereon. The expected emissivity may be determined empirically or theoretically, based on well known emissivity models. According to the invention, the expected emissivity is applied to a controller to produce a converted temperature which controls the radiant heat sources to produce the desired wafer temperature.

In particular, according to one embodiment of the present invention, the expected emissivity is employed to convert the measured pyrometer temperature into a converted pyrometer temperature. The converted pyrometer temperature is applied to a feedback controller which controls the radiant heaters to produce the converted pyrometer temperature equal to the desired wafer processing temperature. In another embodiment, the expected emissivity is employed to convert the desired rapid thermal processing temperature; (often referred to as a "set temperature") into a converted desired rapid thermal processing temperature. The converted desired rapid thermal processing temperature is provided to the controller, which controls the radiant heaters to produce the measured pyrometer temperature equal to the converted desired rapid thermal processing temperature.

According to the present invention the measured pyrometer temperature may be converted to account for the expected emissivity using the following simplified conversion formula:

$$T_c = (\epsilon_p/\epsilon_x)^{\frac{1}{4}} T_p;$$

where $T_p$ is the measured pyrometer temperature, $\epsilon_p$ is the assumed constant wafer emissivity which is provided to the pyrometer, $\epsilon_x$ is the expected emissivity at the pyrometer wavelength which is calculated from the theory of refraction of thin films or from empirical data, and which varies as a function of time, and $T_c$ is the converted pyrometer temperature which is provided to the controller.

Alternatively for exact conversion the following formula may be employed:

$$(exp[C_2/(\lambda T_p)] - 1)/(exp[C_2/(\lambda T_c)] - 1) = \epsilon_p/\epsilon_x$$

where the variables are as described above, $C_2$ is a constant, and $\lambda$ is the pyrometer wavelength.

Finally, for many typical thin film depositions, the exact conversion formula reduces to the following conversion formula:

$$T_c = T_p/[1 - (\lambda T_p/C_2) ln(\epsilon_p/\epsilon_x)].$$

where the variables are as described above.

Regardless of the formula employed according to the present invention, an improved method and apparatus for controlling a rapid thermal processing system is provided which allows reliable thin film deposition without requiring two pyrometers or extensive modifications to existing rapid thermal processing systems.

DESCRIPTION OF THE PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Rapid Thermal Processing System

Figure 1:
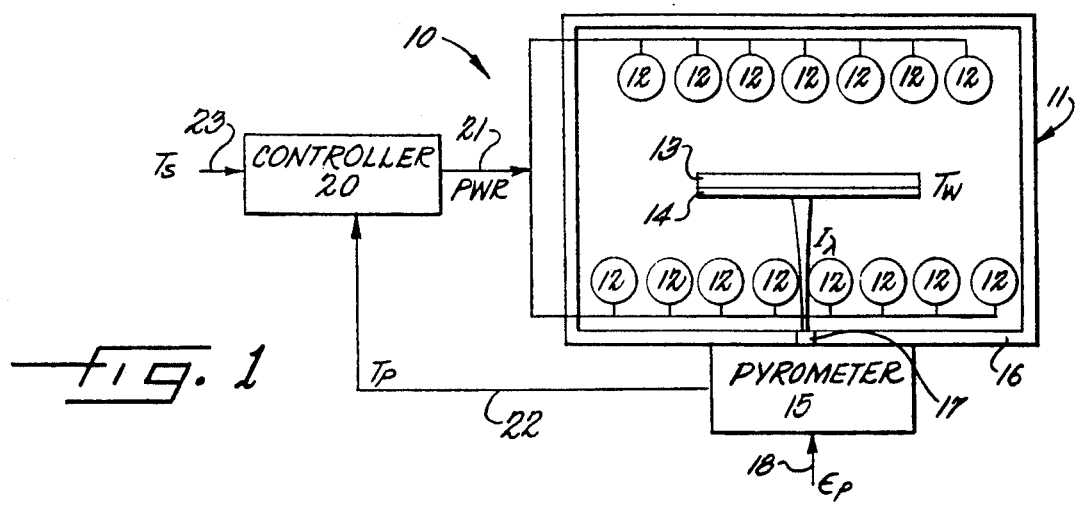
FIG. 1 illustrates a schematic block diagram of a rapid thermal processing system according to the present invention.

Referring now to FIG. 1, a Rapid Thermal Processing (RTP) system according to the present invention will now be described. RTP system 10 includes an RTP furnace 11 and a controller 20 therefor. RTP furnace 11 includes a plurality of radiant heat sources 12, for example tungsten-halogen lamps, for rapidly heating a wafer 13 or other first material placed therein. Controller 20 provides power to lamps 12 using PWR line 21. A wafer 13 is shown in RTP furnace 11. As shown in FIG. 1, a thin film 14 of a second material is being deposited on wafer 13 using well known chemical vapor deposition (CVD) or other deposition processes. For ease of illustration, the support structure for wafer 13 and the deposition apparatus in furnace 11 are not shown.

Still referring to FIG. 1, a pyrometer 15 is coupled to wall 16 of RTP furnace 11 and senses radiation $I\lambda$ emitted from wafer 13 at wavelength $\lambda$, through window 17. Pyrometer 15 produces a measured pyrometer temperature $T_p$ on line 22 which is provided to the controller 20. The controller 20 controls the power to lamps 12 on line 21 to produce a desired wafer processing temperature $T_s$ which is supplied to controller on line 23. According to the invention, the desired processing temperature $T_s$ is maintained regardless of the changes in the emissivity of the wafer as layer 14 is deposited thereon.

It will be understood by those having skill in the art that $T_s$ will be set at different temperatures depending on the particular thin film 14 and the particular wafer 13. Typically $T_s$ is a constant temperature although a time varying desired temperature profile may also be employed.

Figure 2A:
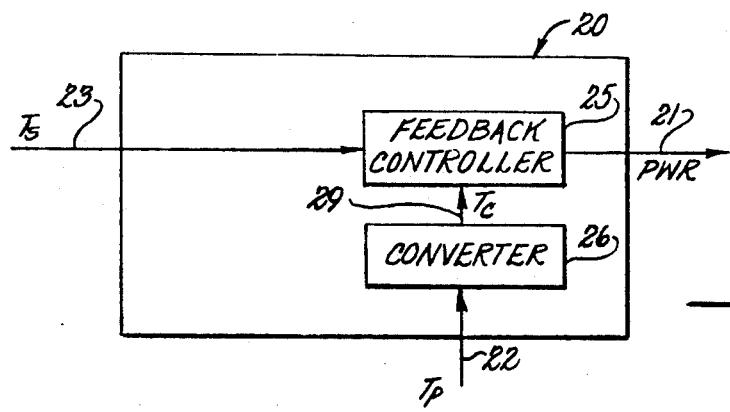
FIGS. 2A and 2B illustrate first and second embodiments, respectively, of a controller for the rapid thermal processing system of FIG. 1, according to the present invention.

Referring now to FIG. 2, two embodiments of the controller 20 of FIG. 1 according to the present invention will now be described. According to the present invention either the desired processing temperature or the measured pyrometer temperature is converted based upon an expected emissivity variation as a function of the thickness of layer 14. In FIG. 2A, the pyrometer temperature $T_p$ on line 22 is modified by converter 26 to produce a converted temperature $T_c$ on line 29. The converted temperature $T_c$ and the desired temperature $T_s$ are both applied to a feedback controller 25 which controls the power on line 21 so that $T_c$ equals $T_s$. It will be understood by those having skill in the art that converter 26 may be physically included as part of pyrometer 15 rather than physically located in controller 20 as shown.

Figure 2B:
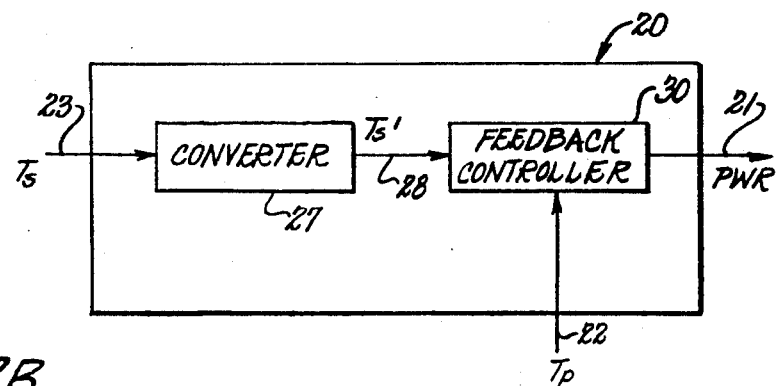

FIG. 2B illustrates an alternative scheme in which the pyrometer temperature $T_p$ is directly applied to a feedback controller 30, and the desired (set) temperature $T_s$ on line 23 is modified to produce a converted set temperature $T_s'$ which is applied to feedback controller 30 at line 28. The power to the lamps 12 on line 21 is controlled by feedback controller 30 so that $T_s' = T_p$.

The calculation of the conversion formula for converters 26 or 27 according to the present invention will now be described. A simplified formula will be derived as well as an exact formula and an approximation thereto. Since all formulas require obtaining the expected emissivity variation of the wafer 13 (FIG. 1) as thin film 14 is deposited thereon, this step will be described first.

Emissivity Variation During Thin Film Deposition

It is now well known that changes in the surface emissivity of a wafer during thin film deposition alter the amount of radiant heat flux absorbed by the wafer and the amount of radiant energy that is emitted. Consequently, the intensity of lamps 12 (FIG. 1) required to hold the wafer at constant temperature must change during deposition. One of the process conditions that produces the largest emissivity change is the deposition of polycrystalline silicon on silicon dioxide. Because of the high index of refraction of polycrystalline silicon, only a small change in thickness will produce a change in the light interference. Therefore, large emissivity changes are produced with relatively thin films. Determination of expected changes in emissivity for chemical vapor deposition of polycrystalline silicon will now be described.

Figure 3:
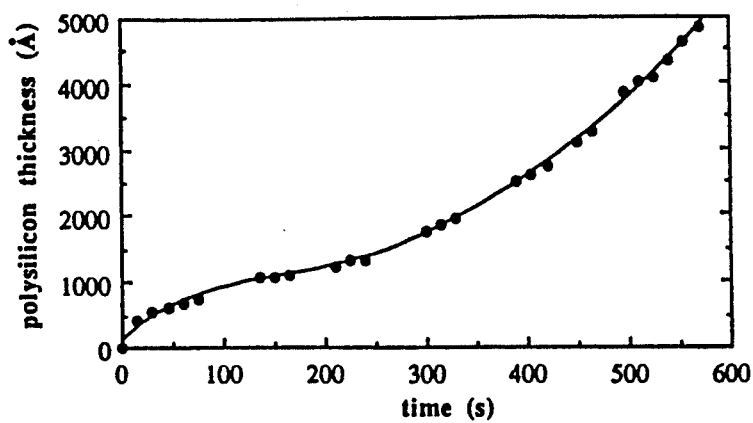
FIGS. 3 through 8 graphically illustrate various rapid thermal processing relationships according to the present invention.

Expected emissivity changes may be determined empirically. In one experiment, an RTP furnace was operated open loop; that is the power on line 21 to lamps 12 was maintained at a constant value. A low pressure chemical vapor deposition (LPCVD) of polycrystalline silicon 14 was performed on a 0.1 micron silicon dioxide layer on a wafer 13. The wafer was removed at 15-20 second intervals, and the thickness of the polycrystalline silicon layer 14 was measured, to thereby provide the thickness of the polycrystalline silicon layer as a function of deposition time. This data is shown in FIG. 3. A curve was fit to the data, as also shown in FIG. 3. The derivative of this curve is the deposition rate as a function of time or of thickness of the deposited layer.

Figure 4:
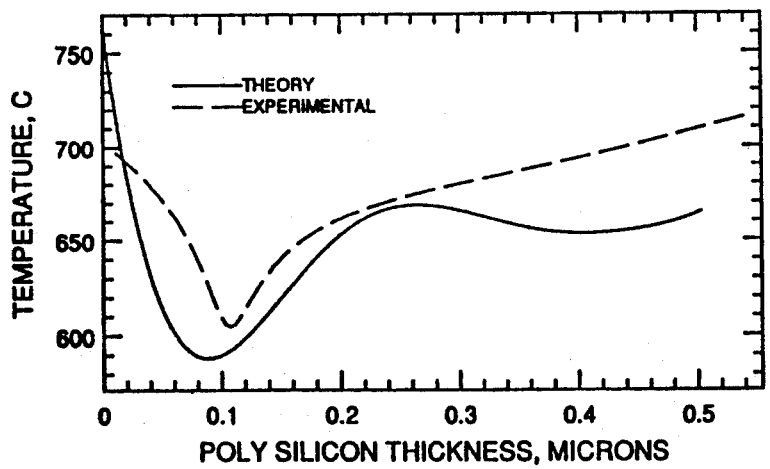

The deposition rate measured this way can be compared to previously obtained data for the deposition rate as a function of temperature. From this known data, the wafer temperature as a function of polycrystalline silicon thickness can be calculated. The result of this calculation is shown in FIG. 4 where the dashed line was obtained by converting the data of FIG. 3 into data representing temperature as a function of polycrystalline silicon thickness. It will be noted that the experimental curve (the dashed line) of FIG. 4 is smooth because it came from a curve fit through the data of FIG. 3.

The expected changes in wafer emissivity as a function of time and temperature may also be determined theoretically. Many techniques are known for determining emissivity changes. One technique is illustrated in the textbook entitled "Principles of Optics" by M. Borne and E. Wolfe, published by Pergamon Press, Elmsford, N.Y. in 1980, at pages 51–70, the disclosure of which is hereby incorporated herein by reference. Another technique for determining expected wafer emissivity as a function of thickness is provided in a textbook entitled "Radiation and Optics", by J. M. Stone, published by McGraw-Hill Book Company, New York, 1963, at pages 388–419, the disclosure of which is incorporated herein by reference. Other procedures for determining expected emissivity are provided in the Pettibone et al. publication cited above, the disclosure of which is incorporated herein by reference, and the Nulman et al. paper described above, the disclosure of which is incorporated herein by reference.

It will be understood by those having skill in the art that the expected emissivity determinations described above determine surface emissivity as a function of radiation wavelength. In order to be used in a heat balance on the wafer, described below, these must be hemispherical emissivities. Accordingly, the emissivities are integrated over wavelength or weighted by the spectra of the source of the radiation. Moreover the emissivity of absorption of radiation, $\epsilon_a$, from the lamp must be weighted by the lamp spectra. Likewise, the emissivity for emission of radiation from the wafer, $\epsilon_e$, must be weighted by the wafer emission spectra. Although actual lamp spectra can be obtained, a black body spectra may also be used for both the lamp and wafer emission. The emissivities are then weighted with a black body spectra at the appropriate temperature. Data indicates that the lamps are at approximately 3000° C., and an average temperature of 700° C. is used for the wafer. The result is a value of $\epsilon_a$ and $\epsilon_e$ as a function of polycrystalline silicon thickness.

The computed values of $\epsilon_a$ and $\epsilon_e$ can then be used in an overall steady state heat balance as follows: During steady state, the heat flux absorbed by the wafer, $Q_{in}$, equals the heat flux emitted by the wafer, $Q_{out}$. That is:

$$Q_{in} = A_a \epsilon_a I_o = Q_{out} = A_e \epsilon_e \sigma T_w^4, \tag{1}$$

where $A_a$ is the wafer area that is absorbing lamp radiation, $A_e$ is the wafer area that emits radiation, $I_o$ is the lamp radiation, assumed uniform over $A_a$, $\sigma$ is the Stefan-Boltzman constant and $T_w$ is the wafer temperature. Thus, $$T_w^4 = (A_a \epsilon_a I_o)/(A_e \epsilon_e \sigma) \tag{2}$$

Initially, the lamp intensity is chosen to maintain the wafer at a set temperature, $T_i$, as the deposition is begun. Therefore, $$A_a \epsilon_{a,i} I_o = A_e \epsilon_{e,i} T_i^4. \tag{3}$$

where $\epsilon_{a,i}$ is the initial value of $\epsilon_a$, and $\epsilon_{e,i}$ is the initial value of $\epsilon_e$. Equation (3) can be solved for $A_a I_o$ and the result used in Equation (2) to obtain:

$$T_w^4 = (\epsilon_z/\epsilon_e)(\epsilon_{e,i}/\epsilon_{a,i})T_i^4 \tag{4}$$

For the example described in FIGS. 3 and 4, the pyrometer was set to give $T_i = 700°$ C. with a bare wafer, and thus it is assumed that $\epsilon_{a,i}$ is equal to $\epsilon_{e,i}$. The theoretical wafer temperature, using equation (4) and the emissivities calculated as described above are shown in the solid line in FIG. 4. An acceptable degree of agreement with the empirical data is found.

According to the present invention, the theoretical and experimental results of FIG. 4 indicate that there must be aggressive feedback control of the furnace during chemical vapor deposition if the wafer is to be maintained at nearly constant temperature. Moreover, according to the invention, a direct feedback control using a pyrometer will not maintain a constant wafer temperature because of the emissivity change at the pyrometer wavelength. Accordingly, the controller 20 (FIG. 1) operates upon a converted pyrometer temperature (FIG. 2A) or a converted desired ("set") temperature (FIG. 2B) to maintain the constant wafer temperature. The calculation of the converted temperature $T_c$ (FIG. 2A) or the converted desired temperature $T_s'$ (FIG. 2B) according to the present invention will now be described. According to the present invention, a simplified conversion formula may be used which approximates the actual conversion required and provides simplified control. An exact conversion will also be described as will an approximation of the exact conversion.

Simplified Temperature Conversion

A simplified conversion will now be described to provide improved pyrometer control according to the present invention. It is well-known to those having skill in the art that the emitted radiation from the wafer 13 is related to the wafer temperature by the following approximation:

$$I_\lambda = K \epsilon_s T_w^4 \tag{5}$$

Where $I_{80}$ is the intensity of emitted radiation the wavelength at the pyrometer wavelength $\lambda$, $T_w$ is the temperature of wafer 13, $\epsilon_s$ is equal to the actual emissivity of the surface of the wafer, and K is a constant determined by the pyrometer characteristics.

Referring again to FIG. 1, the pyrometer temperature $T_p$ on line 22 is related to the intensity of the radiation sensed by the pyrometer, $I_\lambda$, by the following relationship:

$$\lambda = K \epsilon_p T_p^4, \tag{6}$$

where $\epsilon_p$ is the assumed constant value for surface emissivity which is provided to the pyrometer 15 and is used by the pyrometer 15 as a basis for its temperature measurement. Equating equations (5) and (6), one obtains $$K \epsilon_s T_w^4 = K \epsilon_p T_p^4 \tag{7}$$

so that $$T_w = (\epsilon_p/\epsilon_s)^{\frac{1}{4}} T_p \tag{8}$$

Referring now to FIG. 2A, equation (8) may be applied to convert measured pyrometer temperature $T_p$ on line 22 to a converted pyrometer temperature $T_c$ on line 29 by designing converter 26 to perform the following function:

$$T_c = (\epsilon_p/\epsilon_x)^{\frac{1}{4}} T_p \tag{9}$$

It will be understood by those having skill in the art that $\epsilon_x$ is an expected emissivity that is obtained theoretically, empirically or experimentally as was described above.

Referring now to FIG. 2B, equation (8) may be applied to the controller 30 by converting the set (desired) temperature $T_s$ to a converted set temperature $T_s'$ which is equal to $$T_s' = (\epsilon_x/\epsilon_p)^{\frac{1}{4}} T_s \tag{10}$$

where $\epsilon_x$ is obtained as described above.

Exact Compensation Scheme

An exact compensation scheme according to the present invention will now be described. This compensation scheme may require the numerical solution of an exponential equation. In many typical thin film processing cases, the exponential equation may be approximated to provide a simpler logarithmic equation which has a closed form solution, as described below.

It is well-known to those having skill in the art that the radiation intensity at wavelength $\lambda$ emitted by a black body radiator is given by:

$$I_\lambda = C_1/[\lambda^5(exp(C_2/\lambda T) - 1)] \tag{11}$$

where $C_1$ and $C_2$ are constants defined by Plank's law of radiation, as shown in the above described Stone textbook, and T is the black body temperature. Derivation of equation (11) is shown for example in a publication entitled "Radiation Thermometry—The Measurement Problem", by G. D. Nutter, published in *Applications of Radiation Thermometry*, ASTM Special Technical Publication 895, Publication Code number 04-895000-40, 1984, pages 3-23.

For a real surface which does emit black body radiation, $I_\lambda$ is defined by equation 12:

$$I_\lambda = \epsilon_s C_1/[\lambda^5(exp(C_2/\lambda T_w) - 1)] \tag{12}$$

where $\epsilon_s$ is the actual emissivity of the surface and $T_w$ is the actual wafer temperature. Thus, it may be seen from equation (12) that $I_\lambda$ is a function of two variables, i.e. $\epsilon_s$ and $T_w$. As is well-known by those having skill in the art, a pyrometer measures $I_\lambda$ and converts $I_\lambda$ to a temperature. This is accomplished by assuming a value for $\epsilon_s$ which is provided to the pyrometer. For purposes of this analysis, the assumed value of $\epsilon_s$ for the particular surface being measured will be denoted as $\epsilon_p$. Also the pyrometer temperature for $\epsilon_p$ will be denoted as $T_p$. Thus, the pyrometer obtains $I_\lambda$, where $$I_\lambda = \epsilon_p C_1/[\lambda^5(exp(C_2/\lambda T_p) - 1)] \tag{13}$$

and converts $I_\lambda$ to $T_p$, assuming a value of $\epsilon_p$. This conversion may be accomplished by using equation (13) and solving for $T_p$ to obtain:

$$T_p = C_2/[\lambda ln(E_p C_1/\lambda^5 I_\lambda + 1)] \quad (14)$$

Of course, if $\epsilon_p$ does not correspond to the actual emissivity because emissivity varies widely as a result of thin film deposition, the value of $T_p$ obtained from equation (14) will not equal the wafer temperature $T_w$. In other words, because $\epsilon_p$ does not equal to $\epsilon_s$ in the case of a thin film deposition, then $T_p$ does not equal to $T_w$. The relationship between $T_w$ and $T_p$ may be obtained by noting that the following equation governs the measured temperature of a pyrometer:

$$I_\lambda = \epsilon_p C_1/[\lambda^5(exp(C_2/\lambda T_p) - 1)] \quad (15)$$

Equating equations (12) and (15) one obtains $$\epsilon_s C_1/[\lambda^5(exp(C_2/\lambda T_w) - 1)] = \epsilon_p C_1/[\lambda^5(exp(C_2/\lambda T_p) - 1)] \quad (16)$$

Equation (16) may be solved to obtain the relationship between $T_w$ and $T_p$ as follows:

$$\epsilon_s/[exp(C_2/\lambda T_w) - 1] = \epsilon_p/[exp(C_2/\lambda T_p) - 1] \quad (17)$$

or $$[exp(C_2/\lambda T_p) - 1]/[exp(C_2/\lambda T_w) - 1] = \epsilon_p/\epsilon_s \quad (18)$$

Equation (18) is a complex equation which does not have a closed form solution. Accordingly, equation (18) may be solved numerically using well-known techniques to obtain $T_w$ as a function of $T_p$, $\epsilon_p$ and $\epsilon_s$. Since $T_p$ is the measured value obtained from pyrometer 15 (line 22 of FIG. 1) and $\epsilon_p$ is the known input to the pyrometer 15, then if $\epsilon_s$ is known from a theoretical calculation, the relationship between $T_p$ and $T_w$ may be computed. In FIG. 2A, equation (8) may be applied, while in FIG. 2A, equation 2A with a minus sign on either side may be applied.

Approximate Solution For Exact Equation

It will be understood by those having skill in the art that in many situations:

$$exp[C_2/(\lambda T_w)] >> 1 \quad (19)$$

For example if $T_w < 1000°$ C. and $\lambda < 5$ microns relationship (19) will apply. Equation (19) applies for many thin film deposition processes. If equation (19) applies, the "1" in equation (18) may be neglected to thereby obtain:

$$exp[C_2/\lambda T_p]/exp[C_2/\lambda T_w] = \epsilon_p/\epsilon_s \quad (20)$$

Equation (20) may be solved for $T_w$ to obtain:

$$T_w = T_p/[1 - (\lambda T_p/C_2)ln(\epsilon_p/\epsilon_s)] \quad (21)$$

Equation (21) provides a closed form solution for $T_w$ as a function of the measured pyrometer temperature $T_p$, $\epsilon_p$ which is input to the pyrometer, and $\epsilon_s$. If $\epsilon_s$ is known, then $T_w$ may be calculated.

On the other hand, if $exp[C_w/\lambda T]$ is not much greater than 1 then equation (18) may be numerically solved to obtain graphs or tables of $T_w$ as a function of $T_p$, $\epsilon_p$ and $\epsilon_s$, as described above.

Referring now to FIG. 2A, according to the present invention, $\epsilon_x$ is calculated as previously described for the particular deposition conditions and materials. Then, equation (21) is used to convert the measured pyrometer temperature, $T_p$ to a corrected temperature $T_c$ (see FIG. 2A):

$$T_c = T_p/[1 - (\lambda T_p/C_2)ln(\epsilon_p/\epsilon_x)] \quad (22)$$

where $\epsilon_x$ is calculated from the theory of refraction and thin films. $T_c$ is then applied to feedback controller 25 (FIG. 2A) rather than $T_p$ being applied.

Alternatively, as shown in FIG. 2B, set temperature $T_s$ on line 23 may be converted to $T_s'$, the converted set temperature on line 28, by applying the following relationship:

$$T_s' = T_p/[1 + (\lambda T_p/C_2)ln(\epsilon_p/\epsilon_x)] \quad (23)$$

Since $\epsilon_x$ is a function of film thickness and thus of time, the correction will change during the deposition process.

Experimental Results

The results of an experiment to control RTP deposition using the conversion factor of Equation (22) will now be described. It will be understood by those having skill in the art that the theoretical curve of the pyrometer reading $T_p$ as a function of time must be accurate. Since in a practical application, the reflectance of the walls 11 of the furnace (FIG. 1) impact the pyrometer reading, it may be necessary to include the reflectance of the walls in order for the model to be accurate. In practice, unless this is measured experimentally, the reflectance will probably not be known. Moreover, measurements of the reflectance will have some error, and the reflectance may change with time.

In addition, if there is appreciable radiation from the lamps within the pyrometer wavelength band, the theoretical curve for $T_p$ will be altered by this additional radiation. It has also been observed that when the furnace is operated for long periods of time the windows become hot and also may radiate in the infrared region. These effects may need to be included in the model for completely accurate control. However, it is presently anticipated that these features are second order effects so that the procedure was implemented without including any of these effects. Since the implementation appears to provide a well controlled deposition rate, it would appear that effects are only of second order.

Figure 5:
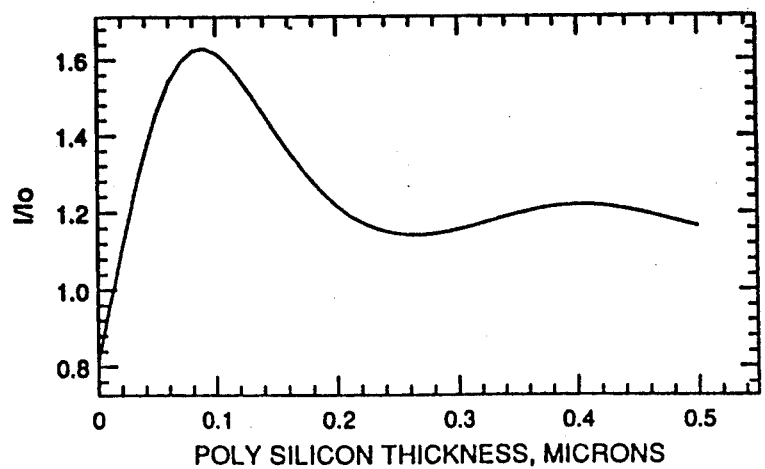
Figure 6:
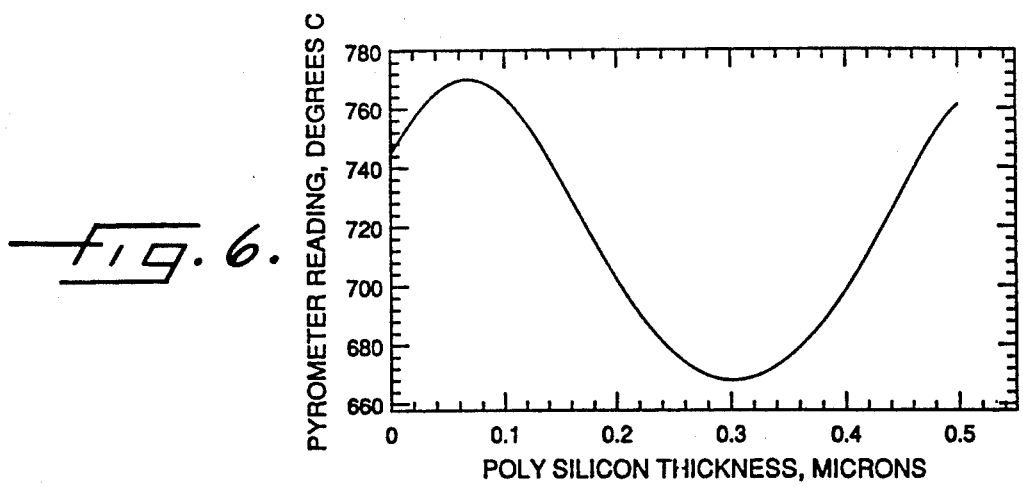

FIG. 5 illustrates the theoretical lamp intensity to maintain a constant wafer temperature as obtained by applying Equation (22). The pyrometer reading as a function of deposition thickness is illustrated in FIG. 6. A furnace reflectance of 0.5 was assumed.

Figure 7:
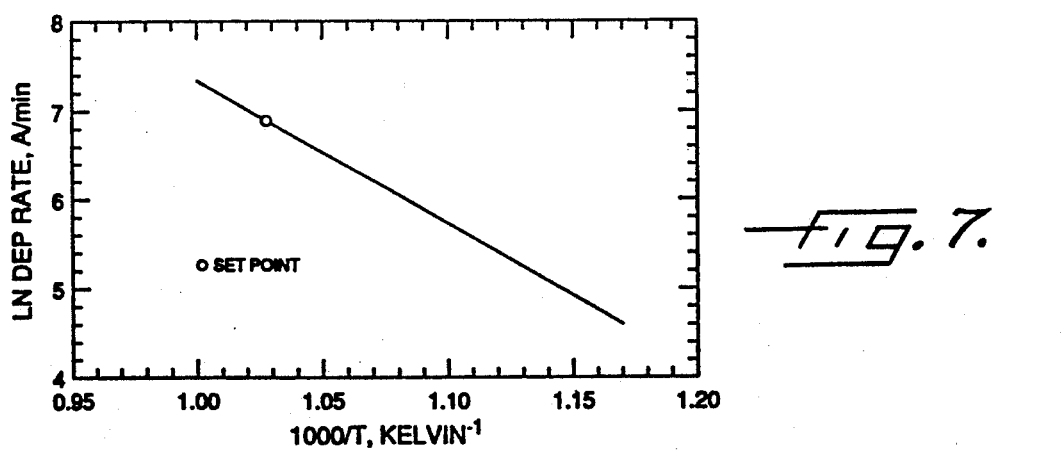

The deposition rates as a function of temperature are shown in FIG. 7. The "set" point is also shown.

Figure 8:
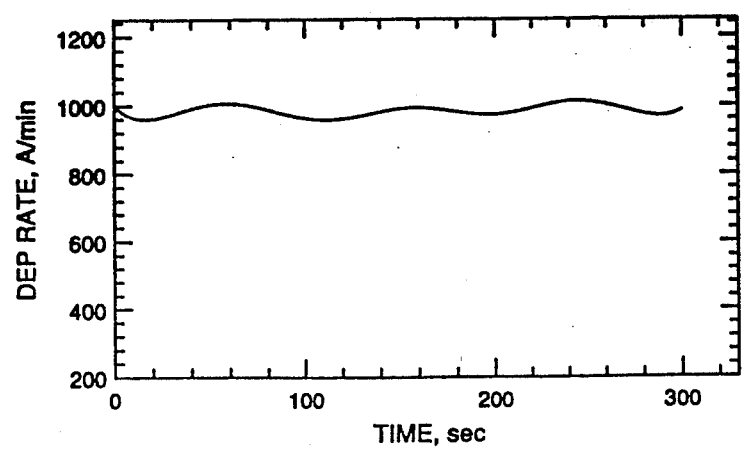

The deposition rate produced by the present invention as a function of time is given in FIG. 8. As shown, accurate furnace control is provided, at a constant deposition rate.

In the drawings and specification, there have been disclosed typical preferred embodiments of the invention and, although specific terms are employed, they are used in a generic and descriptive sense only and not for purposes of limitation, the scope of the invention being set forth in the following claims.

That which we claim is:

1. A rapid thermal processing system comprising:
   a rapid thermal processing furnace having a heat source therein for rapidly heating a first material during deposition of a second material thereon, and a pyrometer for measuring temperature of said first material during deposition of said second material thereon;
   a desired temperature input for setting a desired temperature of said first material during deposition of said second material thereon; and
   a controller connected to said heat source, said pyrometer and said desired temperature input, for controlling said heat source to produce said desired temperature of said first material during deposition of said second material thereon, wherein said controller comprises:
   a converter, connected to said pyrometer, wherein said converter applies a time varying expected emissivity profile of said first material as a function of time to said measured pyrometer temperature, to thereby convert said measured pyrometer temperature into a converted pyrometer temperature; and
   a feedback controller connected to said converter, said heat source and said desired temperature input, for controlling said heat source to produce said converted pyrometer temperature equal to said desired temperature of said first material.

2. The rapid thermal processing system of claim 1 wherein the time varying expected emissivity of said first material is theoretically determined as a function of time for deposition of said second material thereon at said desired temperature of said first material.

3. The rapid thermal processing system of claim 1 wherein the time varying expected emissivity of said first material is empirically determined as a function of time for deposition of said second material thereon at said desired temperature of said first material.

4. The rapid thermal processing system of claim 1 wherein said desired temperature of said first material is a predetermined constant temperature.

5. The rapid thermal processing system of claim 1 wherein said first material is a semiconductor wafer.

6. The rapid thermal processing system of claim 5 wherein said semiconductor wafer comprises a silicon wafer having a silicon dioxide layer thereon, and wherein said second material comprises polycrystalline silicon.

7. The rapid thermal processing system of claim 1 wherein said converter converts said measured pyrometer temperature $T_p$ into a converted pyrometer temperature $T_c$ by applying the following relationship:

$$T_c = (\epsilon_p/\epsilon_x)^{\frac{1}{4}} T_p$$

where $\epsilon_p$ is an assumed constant emissivity which is provided to the pyrometer, and $\epsilon_x$ is the time varying expected emissivity of said first material as a function of time.

8. The rapid thermal processing system of claim 1 wherein said converter converts said measured pyrometer temperature $T_p$ into a converted pyrometer temperature $T_c$ by applying the following relationship:

$$[exp(C_2/\lambda T_p) - 1]/[exp(C_2/\lambda T_c) - 1] = \epsilon_p/\epsilon_x$$

where $\epsilon_p$ is an assumed constant emissivity which is provided to the pyrometer, $\epsilon_x$ is the time varying expected emissivity of said first material as a function of time as determined in said determining step, and $\lambda$ is the pyrometer wavelength.

9. The rapid thermal processing system of claim 1 wherein said converter converts said measured pyrometer temperature $T_p$ into a converted pyrometer temperature $T_c$ by applying the following relationship:

$$T_c = T_p/[1 - (\lambda T_p/C_2)ln(\epsilon_p/\epsilon_x)]$$

where $\epsilon_p$ is an assumed constant emissivity which is provided to the pyrometer, $\epsilon_x$ is the time varying expected emissivity of said first material as a function of time as determined in said determining step, and $\lambda$ is the pyrometer wavelength.

10. A rapid thermal processing system comprising:
    a rapid thermal processing furnace having a heat source therein for rapidly heating a first material during deposition of a second material thereon, and a pyrometer for measuring temperature of said first material during deposition of said second material thereon;
    a desired temperature input for setting a desired temperature of said first material during deposition of said second material thereon; and
    a controller connected to said heat source and said pyrometer and said desired temperature input, for controlling said heat source to produce said desired temperature of said first material during deposition of said second material thereon, wherein said controller comprises:
    a converter, connected to said desired temperature input, wherein said converter applies a time varying expected emissivity profile of said first material as a function of time to said desired temperature, to thereby convert said desired temperature of said first material into a converted desired temperature of said first material; and
    a feedback controller connected to said converter, said pyrometer and said heat source, for controlling said heat source to provide a measured pyrometer temperature equal to said converted desired temperature of said first material.

11. The rapid thermal processing system of claim 10 wherein said converter converts said desired temperature of said first material $T_s$ into a converted desired wafer temperature of said first material $T_s'$ by applying the following relationship:

$$T_s' = (\epsilon_x/\epsilon_p)^{\frac{1}{4}} T_s$$

where $\epsilon_p$ is an assumed constant emissivity which is provided to the pyrometer, and $\epsilon_x$ is the time varying expected emissivity of said first material as a function of time.

12. The rapid thermal processing system of claim 10 wherein said converter converts said desired temperature of said first material $T_s$ into a converted desired temperature of said first material $T_s'$ by applying the following relationship:

$$[exp(C_2/\lambda T_s') - 1]/([exp(C_2/\lambda T_s) - 1] = \epsilon_p/\epsilon_x$$

where $\epsilon_p$ is an assumed constant emissivity which is provided to the pyrometer, $\epsilon_x$ is the time varying expected emissivity of said first material as a function of time as determined in said determining step, and $\lambda$ is the pyrometer wavelength.

13. The rapid thermal processing system of claim 10 wherein said converter converts said desired temperature of said first material $T_s$ into a converted desired temperature of said first material $T_s'$ by applying the following relationship:

$$T_s' = T_s/[1+(\lambda T_p/C_2)ln(\epsilon_p/\epsilon_x)]$$

where $\epsilon_p$ is an assumed constant emissivity which is provided to the pyrometer, $\epsilon_x$ is the time varying expected emissivity of said first material as a function of time as determined in said determining step, and $\lambda$ is the pyrometer wavelength.

* * * * *

UNITED STATES PATENT AND TRADEMARK OFFICE
CERTIFICATE OF CORRECTION

PATENT NO. : 5,155,337
DATED : October 13, 1992
INVENTOR(S) : Sorrell et al.

It is certified that error appears in the above-identified patent and that said Letters Patent is hereby corrected as shown below:

Column 7, line 11, please delete Equation (4) and substitute the following:

$$T_w^4 = (\varepsilon_a/\varepsilon_e)(\varepsilon_{e,i}/\varepsilon_{a,i}) T_i^4 \qquad (4)$$

Column 7, line 51, "$I_{80}$" should be --$I_\lambda$--.

Column 7, line 61, please delete Equation (6) and substitute the following:

$$I_\lambda = K\varepsilon_p T_p^4 , \qquad (6)$$

UNITED STATES PATENT AND TRADEMARK OFFICE
CERTIFICATE OF CORRECTION

PATENT NO. : 5,155,337
DATED : October 13, 1992
INVENTOR(S) : Sorrell et al

It is certified that error appears in the above-indentified patent and that said Letters Patent is hereby corrected as shown below:

Column 9, line 50, after "example" please insert --,--.

Signed and Sealed this

Twenty-eighth Day of September, 1993

Attest:

BRUCE LEHMAN

*Attesting Officer*  *Commissioner of Patents and Trademarks*